United States Patent
Zhou (10) Patent No.: US 10,748,814 B2
(45) Date of Patent: Aug. 18, 2020

(54) FABRICATION METHOD OF SEMICONDUCTOR DEVICE BY REMOVING SACRIFICIAL LAYER ON GATE STRUCTURES

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/193,137

(22) Filed: Nov. 16, 2018

(65) Prior Publication Data
US 2019/0164831 A1    May 30, 2019

(30) Foreign Application Priority Data
Nov. 24, 2017 (CN) .......................... 2017 1 1191442

(51) Int. Cl.
| | | |
|---|---|---|
| *H01L 21/768* | (2006.01) | |
| *H01L 23/535* | (2006.01) | |
| *H01L 29/45* | (2006.01) | |
| *H01L 29/78* | (2006.01) | |
| *H01L 29/66* | (2006.01) | |
| *H01L 21/285* | (2006.01) | |

(Continued)

(52) U.S. Cl.
CPC .. *H01L 21/76897* (2013.01); *H01L 21/28518* (2013.01); *H01L 21/76805* (2013.01); *H01L 21/76895* (2013.01); *H01L 21/823431* (2013.01); *H01L 23/535* (2013.01); *H01L 29/41791* (2013.01); *H01L 29/45* (2013.01); *H01L 29/66545* (2013.01); *H01L 29/66795* (2013.01); *H01L 29/7851* (2013.01)

(58) Field of Classification Search
CPC ......... H01L 21/76897; H01L 21/76895; H01L 21/28518; H01L 21/76805
See application file for complete search history.

(56) References Cited

U.S. PATENT DOCUMENTS

2012/0187504 A1* 7/2012 Igarashi ............ H01L 21/76895
                                                                257/390
2012/0261727 A1* 10/2012 Zhong ..................... H01L 29/78
                                                                257/288

(Continued)

*Primary Examiner* — Michael Jung
(74) *Attorney, Agent, or Firm* — Anova Law Group, PLLC (57) ABSTRACT

A semiconductor device and fabrication method thereof are provided. The method includes: providing a base substrate with first gate structures on the base substrate; forming a spacer covering sidewalls of each first gate structure; forming sacrificial layers on sides of each first gate structure to cover corresponding spacers; forming a bottom dielectric layer covering sidewalls of the sacrificial layers; after forming the bottom dielectric layer, removing the sacrificial layers by etching to form first openings between the bottom dielectric layer and the spacer; and forming a plug in each first opening.

21 Claims, 6 Drawing Sheets

(51) Int. Cl.
*H01L 21/8234* (2006.01)
*H01L 29/417* (2006.01)

(56) References Cited

U.S. PATENT DOCUMENTS

2013/0328127 A1* 12/2013 Chen .................. H01L 27/1104
                                                            257/368
2017/0221757 A1*  8/2017 Hsieh ................ H01L 21/76834
2018/0068951 A1*  3/2018 Hung .................. H01L 23/485

* cited by examiner

FABRICATION METHOD OF SEMICONDUCTOR DEVICE BY REMOVING SACRIFICIAL LAYER ON GATE STRUCTURES

CROSS-REFERENCES TO RELATED APPLICATIONS

This application claims the priority of Chinese Patent Application No. 201711191442.9, filed on Nov. 24, 2017, the content of which is incorporated herein by reference in its entirety.

TECHNICAL FIELD

The present disclosure generally relates to the field of semiconductor technologies and, more particularly, relates to a semiconductor device and its fabrication method.

BACKGROUND

A metal-oxide-semiconductor (MOS) transistor is one of the most important devices in modern integrated circuits. A MOS transistor usually includes a semiconductor substrate, gate structures on a surface of the semiconductor substrate, and source/drain regions in the semiconductor substrate on sides of each gate structure. Each gate structure includes a gate dielectric layer on the surface of the semiconductor substrate and a gate electrode layer on a surface of the gate dielectric layer.

In a MOS transistor, a voltage is applied to a gate structure, to regulate channel currents under the gate structure and generate on/off signals.

However, performance of conventional semiconductor devices formed by the MOS transistors still needs improved.

SUMMARY

One aspect of the present disclosure provides a fabrication method for forming a semiconductor device. The method includes: forming a base substrate and first gate structures on the base substrate; forming a spacer covering sidewalls of each first gate structure; forming sacrificial layers on sides of each first gate structure to cover the corresponding spacer; forming a bottom dielectric layer covering sidewalls of the sacrificial layers; after forming the bottom dielectric layer, removing the sacrificial layers by etching to form first openings between the bottom dielectric layer and the spacer; and forming a plug in each first opening.

Another aspect of the present disclosure provides a semiconductor device formed by a fabrication method provided by the present disclosure. The semiconductor device includes: a base substrate; a fin protruding from the base substrate; gate structures on the fin; source/drain doped layers in the base substrate on sides of each gate structure; an offset spacer on each sidewall of each gate structure; a spacer covering each sidewall of the offset spacer and each sidewall of the gate structure; a bottom dielectric layer on the base substrate; and a plug between the spacer and the bottom dielectric layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor device may be formed by: providing a base substrate with first gate structures on the substrate; forming a spacer on sidewalls of the first gate structures; forming source/drain doped regions in the base substrate on sides of each first gate structure and the spacer; forming an interlayer dielectric layer on the base substrate and on the source/drain doped regions to cover sidewalls of the spacer; forming gate openings in the interlayer dielectric layer by removing the first gate structures; forming a second gate structure in each gate opening; forming plug openings in the interlayer dielectric layer on sides of each second gate structure to expose the spacers; and forming a plug in each plug opening.

The plug openings may be formed by a self-aligned contact hole process.

The plug openings may be formed in the interlayer dielectric layer on sides of each second gate structure by etching the interlayer dielectric layer on sides of each second gate structure. In the etching process for forming the plug openings, to reduce a loss of the spacer, the interlay dielectric layer may have an etching rate larger than an etching rate of the spacer. Correspondingly, a choice of spacer material may be limited by a material of the interlayer dielectric layer. Usually the interlayer dielectric layer may be made of silicon oxide and the spacers may be made of $SiN_x$. Since SiNx has a dielectric constant larger than a dielectric constant of silicon oxide, the spacer with a large dielectric constant may induce a large parasitic capacitance in the semiconductor device and the semiconductor device may have a poor performance.

The present disclosure provides a semiconductor device and fabricating method. The fabrication method may include: forming a spacer on sidewalls of the first gate structures; forming sacrificial layers at sides of each first gate structure to cover the spacer; forming a bottom dielectric layer on the base substrate to cover sidewalls of each sacrificial layer; removing the sacrificial layers by etching to form first openings between the bottom dielectric layer and the spacer; and forming a plug in each first opening. The method may improve a performance of the semiconductor device.

FIG. 1 to FIG. 11 illustrate semiconductor structures corresponding to certain stages for forming an exemplary semiconductor device according to various disclosed embodiments of present disclosure. FIG. 12 illustrates an exemplary method for forming a semiconductor device according to various disclosed embodiments.

Figure 1:
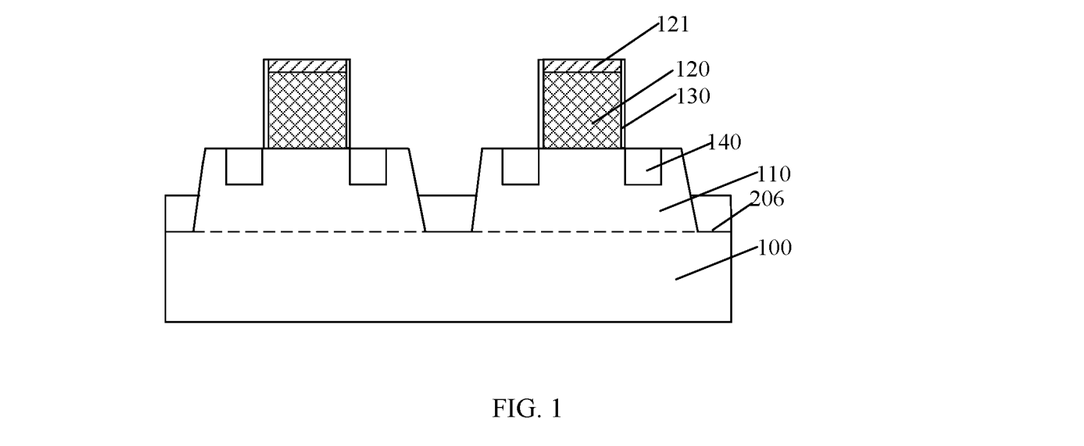
FIG. 1 to FIG. 11 illustrate semiconductor structures corresponding to certain stages for forming an exemplary semiconductor device according to various disclosed embodiments of the present disclosure.

As illustrated in FIG. 1, a base substrate with first gate structures 120 may be provided (in Step S802 in FIG. 12).

In one embodiment, the semiconductor device may be a fin field effect transistor (FinFET). In other embodiments, the semiconductor device may be a planar MOS transistor.

In one embodiment, when the semiconductor device is a FinFET, the base substrate may include a semiconductor substrate 100 and fins 110 protruding from the semiconductor substrate 100. In other embodiments, when the semiconductor device is a planar MOS transistor, the base substrate may be a planar semiconductor substrate.

In one embodiment, the method may further include: forming an isolation layer 206 on the semiconductor substrate 100. The isolation layer 206 may cover a portion of sidewalls of the fins 110 and may have a top surface lower than top surfaces of the fins 100. The isolation layer 206 may be made a material including silicon oxide.

Each first gate structure 120 may include a first gate dielectric layer on the base substrate and a first gate electrode layer on the first gate dielectric layer. The first gate dielectric layer may be made of a material including silicon oxide and the first gate electrode layer may be made of a material including polysilicon.

In one embodiment, each first gate structure 120 may cross a fin 110 and cover a portion of the top surface of the fin 120 and a portion of side surfaces of the fin 110. Each first gate structure 120 may be formed on a portion of the top surface of the isolation layer 206, and may cover a portion of the top surface of the fin 120 and a portion of side surfaces of the fin 110.

A number of the first gate structures 120 may be one or more.

In one embodiment, a mask protection layer 121 may be formed on a top surface of each first gate structure 120. The mask protection layer 121 may be made of a material including $SiN_x$.

In one embodiment, the method may further include forming offset spacers 130 on sidewalls of each first gate structure 120. The offset spacers 130 may be formed on the sidewalls of each first gate structure 120 and on sidewalls of each mask protection layer 121. The offset spacers 130 may be made of a material including $SiN_x$, and may have a thickness of about 3 nm to about 10 nm.

In one embodiment, the method may further include performing a light doping implantation process on the base substrate on the sides of each first gate structure 120 and each offset spacer 130, to form lightly doped regions in the base substrate on the sides of each first gate structure 120 and each offset spacer 130. The lightly doped regions may be formed in the fins 110 on the sides of each first gate structure 120 and each offset spacer 130.

In one embodiment, the method may further include forming source/drain doped layers 140 in the base substrate on the sides of each first gate structure 120 and each offset spacer 130. The source/drain doped layers 140 may be formed in the fins 110 on the sides of each first gate structure 120 and each offset spacer 130.

In one embodiment, a process for forming the source/drain doped regions may be performed after the lightly doped implantation process.

In one embodiment, the source/drain doped regions may be formed by: forming source/drain grooves in the fins 110 on the sides of each first gate structure 120 and each offset spacer 130; and forming a source/drain doped layer 140 in each source/drain groove by an epitaxial growth process.

When forming the source/drain doped layers 140, the offset spacers 130 and the mask protection layers 120 may protect the first gate structures 120, to avoid a growth of a material of the source/drain doped layers 140 on surfaces of the first gate structures 120.

The offset spacers 130 may be used as a mask for the lightly doped implantation process and may define a distance between a lightly doped region and the corresponding first gate structure. The offset spacers 130 may also define a distance between a source/drain doped layer and the corresponding first gate structure 120.

Figure 2:
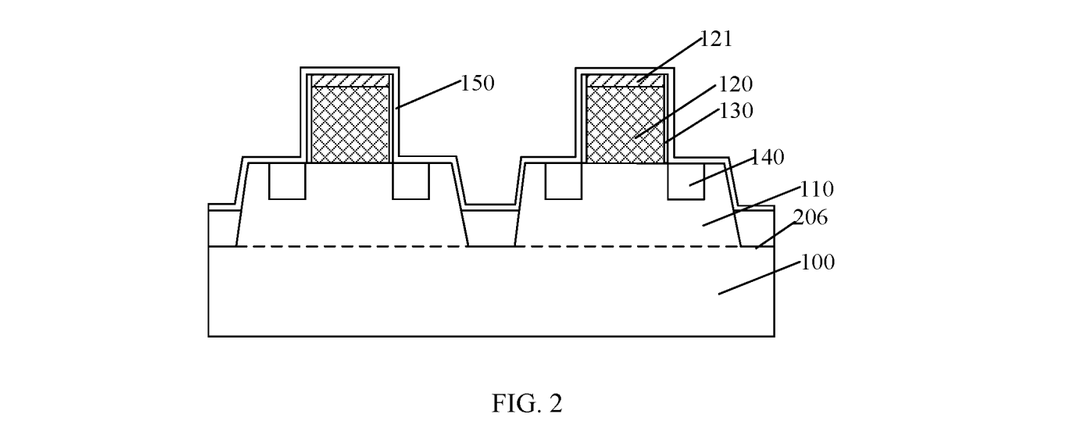

As illustrated in FIG. 2, a spacer 150 may be formed to cover the sidewalls of the first gate structures 120 (in Step S804 in FIG. 12).

The spacer 150 may be made of a material including silicon oxide and SiOCN.

The spacer 150 may have a dielectric constant of about 2.5 to about 3.7.

The spacer 150 may have a thickness of about 5 nm to about 12 nm.

The spacer 150 may be also formed on the base substrate, on the top surfaces of the source/drain doped layers 140, and on the tops of the first gate structures 120.

In one embodiment, the mask protection layers 121 may be formed on the first gate structures 120, and correspondingly the spacer 150 may be also formed on the sidewalls and on the top surfaces of the mask protection layers 121.

The offset spacers 130 on the sidewalls of each first gate structure 120 may be located between the spacer 150 on the sidewalls of the corresponding first gate structure 120 and the corresponding first gate structure 120. The offset spacers 130 on the sidewalls of each mask protection layer 121 may be located between the spacer 150 on the sidewalls of the corresponding mask protection layer 121 and the corresponding mask protection layer 121.

A portion of the spacer 150 on the sidewalls of each first gate structure 120 may regulate a distance between the subsequent sacrificial layer and the corresponding first gate structure 120, and regulate a distance between a subsequent plug and a corresponding second gate structure. A portion of the spacer 150 on the top surfaces of the source/drain doped layers 140 may be used as a stopping layer when removing the sacrificial layers by etching.

The spacer 150 may be formed by an atomic layer deposition process and a thickness of the formed spacer may have a good uniformity.

Figure 3:
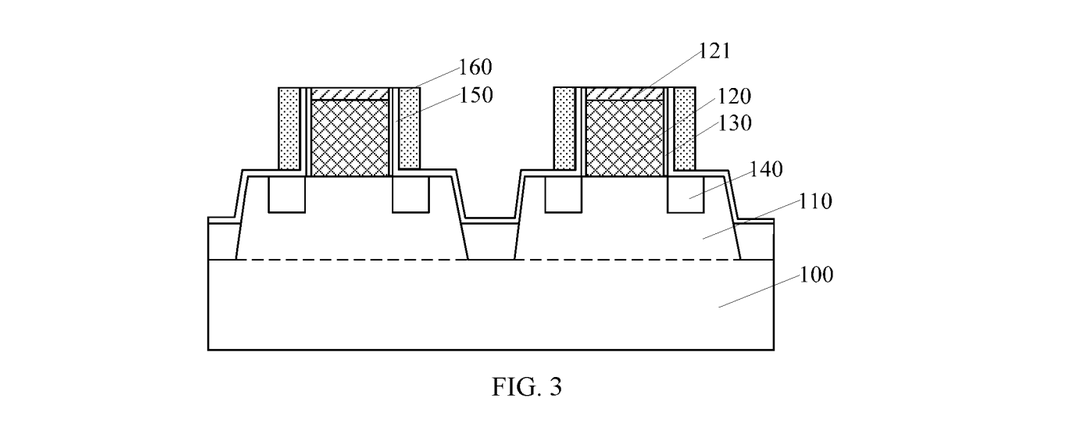

As illustrated in FIG. 3, the sacrificial layers 160 may be formed on the sides of each first gate structure to cover the spacers 150 (in Step S806 in FIG. 12).

The sacrificial layers 160 may be also formed on the source/drain doped layers 140, and may be made of a material including amorphous silicon or polysilicon.

Each first gate structure 120 may have first sides opposite to each other and second sides opposite to each other. The sacrificial layers 160 may cover the spacer 150 on the sidewalls of the first sides of each first gate structure 120, and may expose the spacer 150 on the sidewalls of the second sides of each first gate structure 120.

The sacrificial layers 160 may be formed by: forming a sacrificial film on the base substrate to cover the base substrate, the spacer 150 and the first gate structures 120; planarizing the sacrificial film to remove a first portion of the sacrificial film on the tops of the first gate structures 120; and removing a second portion of the sacrificial film on the sidewalls of the second sides of the first gate structures 120 by etching to form the sacrificial layers 160.

In one embodiment, when planarizing the sacrificial film, a third portion of the sacrificial film on the tops of the offset spacers 130 and on the top surface of the spacer 150 on the sidewalls of the first gate structures 120 may be also removed.

The sacrificial layers 160 may be used to define positions of subsequent first openings. The sacrificial layers 160 may be removed to form the first openings subsequently.

In one embodiment, a portion of the spacer 150 on the top of each first gate structure 120 may be removed when forming the sacrificial layers 160. A portion of the spacer 150 on the top of each mask protection layer 121 may also be removed when forming the sacrificial layers 160.

In one embodiment, the sacrificial films may be planarized to expose the top surfaces of the mask protection layers 121.

The top surfaces of the mask protection layers 121 may be exposed after forming the sacrificial layers 160 and before removing the first gate structures 120.

After forming the sacrificial layers 160, a portion of the spacer 150 may be located between each sacrificial layer 160 and the base substrate. A portion of the spacer 150 may be also located between each sacrificial layer 160 and a corresponding source/drain doped layer 140.

Figure 4:
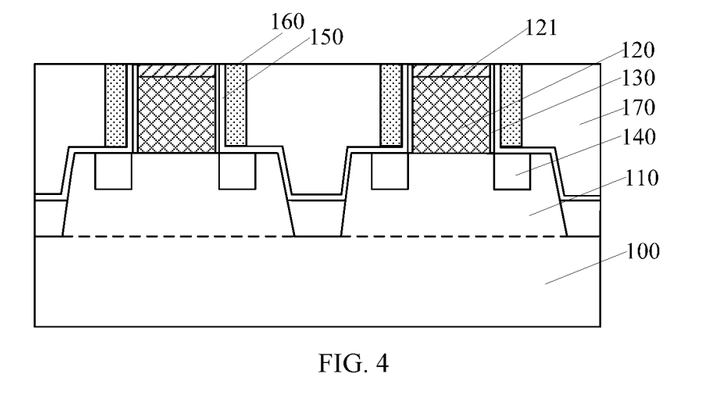

As illustrated in FIG. 4, a bottom dielectric layer 170 may be formed on the base substrate to cover the sidewalls of the sacrificial layers 160 (in Step S808 in FIG. 12).

The bottom dielectric layer 170 may be made of a material including silicon oxide.

After forming the bottom dielectric layer, the sacrificial layers 160 may be removed to form the first openings between the bottom dielectric layer 170 and the spacer 150.

In one embodiment, the method may further include: after forming the bottom dielectric layer 170 and before removing the sacrificial layers 160, removing the first gate structures 120 to form gate openings with spacer 150 on sidewalls of the gate openings, in the bottom dielectric layer 170; forming a second gate structure in each gate opening; and removing the sacrificial layers 160 after forming the second gate structures.

In one embodiment, the method may further include removing the mask protection layers 121 after forming the bottom dielectric layer 170 but before removing the first gate structures 120.

In one embodiment, the method may further include: before removing the first gate structures 120 and the mask protection layers 121, etching a partial height of each sacrificial layer 160 to make the top of the sacrificial layer 160 lower than a top surface of the bottom dielectric layer 170 and to form a third opening on each sacrificial layer 160 between the bottom dielectric layer 170 and the corresponding spacer 150; forming a cap layer in each third opening; removing the mask protection layers 121 and the first gate structures 120; and removing the cap layers when forming the second gate structures.

Figure 5:
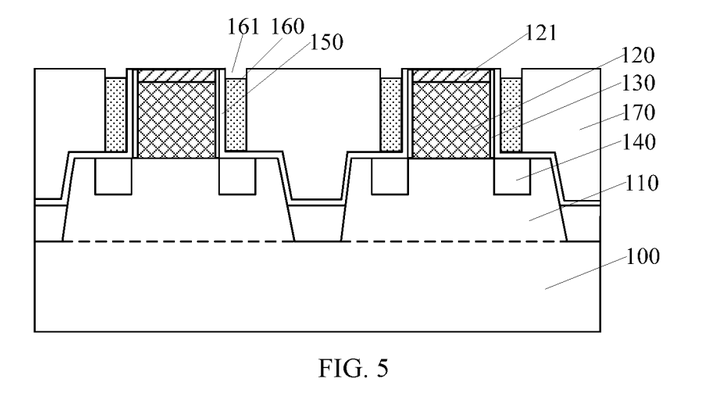

As illustrated in FIG. 5, a partial height of each sacrificial layer 160 may be etched to make the top of the sacrificial layer 160 lower than the top surface of the bottom dielectric layer 170, and to form a third opening 161 on each sacrificial layer 160 between the bottom dielectric layer 170 and the corresponding spacer 150 (in Step S810 in FIG. 12).

A partial height of each sacrificial layer 160 may be etched to form a third opening by a dry etching process or a wet etching process. In one embodiment, a partial height of each sacrificial layer 160 may be etched to form a third opening by a dry etching process using an etching gas including HBr and $H_2$.

Figure 6:
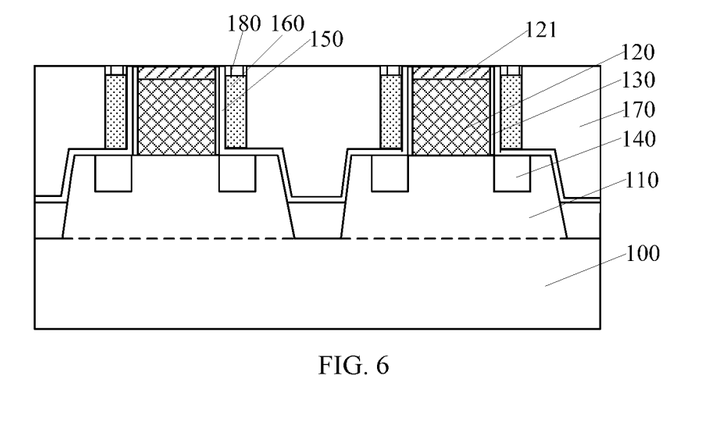

As illustrated in FIG. 6, a cap layer 180 may be formed in each third opening 161 (in Step S812 in FIG. 12).

The cap layers 180 may be made of a material including $SiO_2$, $SiN_x$, and/or SiBCN. In one embodiment, the cap layers 180 may be made of $SiO_2$.

The cap layers 180 may protect the sacrificial layers 160 in a subsequent process for removing the first gate structures 120 (especially for removing the first gate electrode layers), to avoid etching the sacrificial layers 160 by the process for removing the first gate structures 120.

The cap layers 180 may be formed by: forming a cap film in the third openings 161, on the bottom dielectric layer 170, on the first gate structures 120, on the spacer 150, and on the mask protection layers 121; and planarizing the cap film to remove a portion of the cap film on the first gate structures 120 and to form the cap layers 180.

In one embodiment, the cap film may be planarized to expose the top surfaces of the mask protection layers 121.

The cap film may be planarized by a chemical mechanical polishing process.

In one embodiment, a bottom surface of each cap layer 180 may be higher than or be flush with the top surface of the corresponding first gate structure 120. Subsequently, the cap layers 180 may be removed when forming the second gate structures. A bottom surface of each cap layer 180 may determine the top surface of the corresponding second gate structure. A bottom surface of each cap layer 180 higher than or flush with the top surface of the corresponding first gate structure 120, may avoid a small height of the second gate structure in comparison with the first gate structure.

In other embodiments, the bottom surface of each cap layer 180 may be lower than the top surface of the corresponding first gate structure 120.

In one embodiment, the cap layers 180 may have a thickness of about 20 nm to about 50 nm. If the thickness of the cap layers 180 is smaller than 20 nm, the cap layers 180 may not protect the sacrificial layers 160 enough when removing the first gate structures 120. If the thickness of the cap layers 180 is larger than 50 nm, the height of the second gate structures may be too small in comparison with the first gate structures 120 and a size of the second gate structure may not meet the process requirements.

In other embodiments, the third openings and the cap layers may be not formed.

Figure 7:
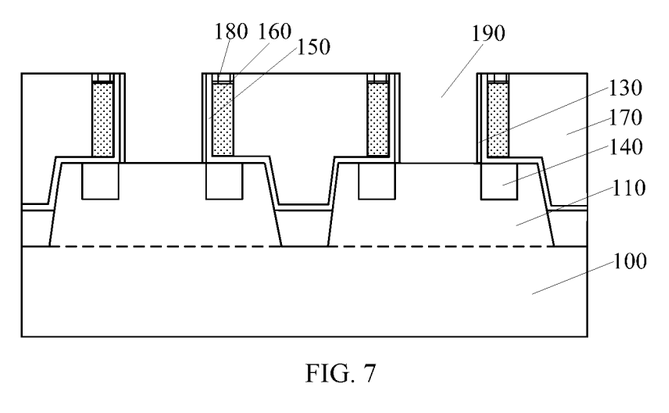

As illustrated in FIG. 7, after forming the cap layers 180, the first gate structures 120 may be removed to form gate openings 190 in the bottom dielectric layer 170 (in Step S814 in FIG. 12). A portion of the spacer 150 may be located on sidewalls of each gate opening 190.

The offset spacers 130 may be located on the sidewalls of each gate opening 190, and a portion of the spacer 150 on the sidewalls of each gate opening 190 may be between the bottom dielectric layer 170 and the corresponding offset spacer 130.

In one embodiment, the mask protection layers 121 may be removed after forming the cap layers 180 but before removing the first gate structures 120.

In one embodiment, after forming the cap layers 180, a portion of the spacer 150 may be not located on the top of each first gate structure 120, and correspondingly a process for removing a portion of the spacer 150 on the top of each first gate structure 120 may be avoided. Then a damage to the bottom dielectric layer 170 and to the cap layers 180 by the process for removing a portion of the spacer 150 on the top of each first gate structure 120 may be avoided.

In one embodiment, the sacrificial film may be planarized to expose the spacers on the top surfaces of the mask protection layers, and a portion of the spacer on the first gate structures may be removed when planarizing the cap film.

In other embodiments, the sacrificial film may be planarized to expose a portion of the spacer on the top surfaces of the mask protection layers, and a portion of the spacer on the first gate structures may not be removed when planarizing the cap film. A portion of the spacer on the first gate structures may be removed after forming the cap layers, and the mask protection layers and the first gate structures may be removed then.

Figure 8:
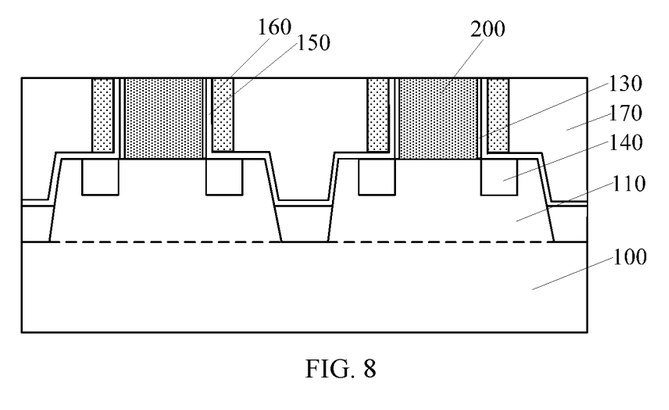

As illustrated in FIG. 8, a second gate structure may 200 be formed in each gate opening 190 (in Step S816 in FIG. 12).

In one embodiment, the cap layers 180 may be removed when forming the second gate structures 200.

The second gate structures 200 may be formed by: forming a second gate structure material layer in the gate openings 190, on the offset spacers 130, on the spacer 150, on the cap layers 180, and on the bottom dielectric layer 170; and planarizing the second gate structure material layer to remove a first portion of the second gate structure material layer on the bottom dielectric layer 170, a second portion of the second gate structure material layer on the offset spacer 130 and the spacer 150; and removing the cap layers 180.

Each second gate structure 200 may include a second gate dielectric layer and a second gate electrode layer in the corresponding gate opening 190. The second gate dielectric layer may be formed on the sidewalls and a bottom of the corresponding gate opening 190. The second gate electrode layer may be on the second gate dielectric layer. The second gate dielectric layers may be made of a high-K (K is larger than 3.9) dielectric material, and the second gate electrode layers may be made of a metal including W.

Figure 9:
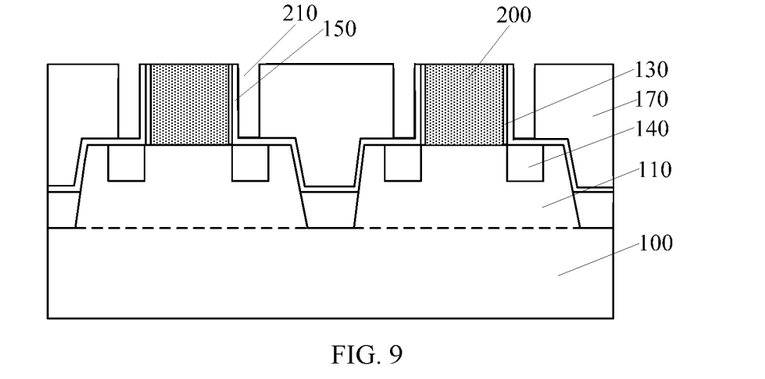

As illustrated in FIG. 9, the sacrificial layers 160 may be removed by etching after forming the second gate structures, to form first openings 210 between the bottom dielectric layer 170 and the spacer 150 (in Step S818 in FIG. 12).

The first openings 210 may be formed between the bottom dielectric layer and the spacer 150 on sidewalls of each second gate structure 200.

When removing the sacrificial layers 160, a ratio between an etching rate of the sacrificial layers 160 and an etching rate of the spacer 150 may be about 80:1 to about 200:1. A ratio between the etching rate of the sacrificial layers 160 and an etching rate of the bottom dielectric layer 170 may be about 50:1 to about 100:1.

The sacrificial layers 160 may be removed by a dry etching process or a wet etching process. In one embodiment, the sacrificial layers 160 may be removed by a dry etching process using an etching gas including HBr and $H_2$.

In one embodiment, the sacrificial layers 160 may be removed to expose the spacers 150 on the top surfaces of the source/drain doped layers 140.

In one embodiment, the method may further include etching a portion of the spacer 150 on the bottom of each first opening 120, to expose the top surface of the source/drain doped layers 140, and to form a second opening in the bottom of each first opening 120.

Since the first openings 210 is formed by etching away the sacrificial layers 160 instead of removing a portion of the bottom dielectric layer 170, a choice of a material for the spacer 150 may be not limited by the material of the bottom dielectric layer 170. Correspondingly, the spacer 150 may be made of a material with a relatively low dielectric constant and a parasitic capacitance of the semiconductor device may be reduced.

Figure 10:
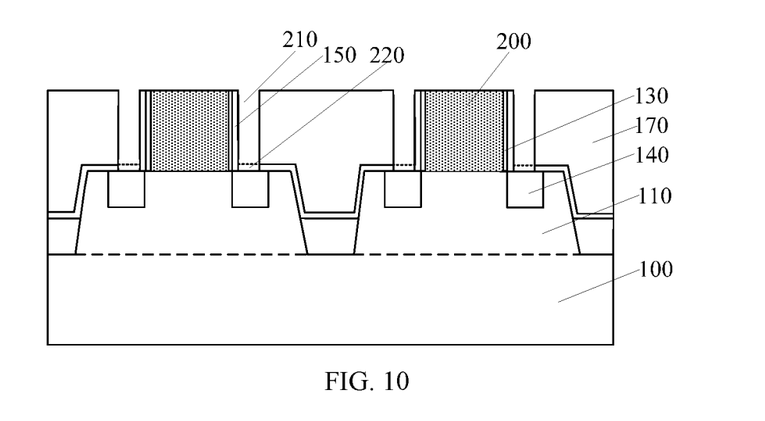

As illustrated in FIG. 10, a portion of the spacer 150 on the bottom of each first opening 120 may be etched, to expose the top surface of the corresponding source/drain doped layer 140, and to form a second opening 230 in the bottom of each first opening 120.

Figure 11:
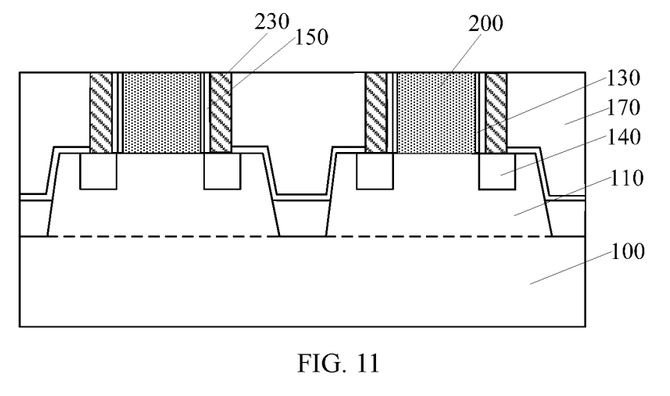
Figure 12:
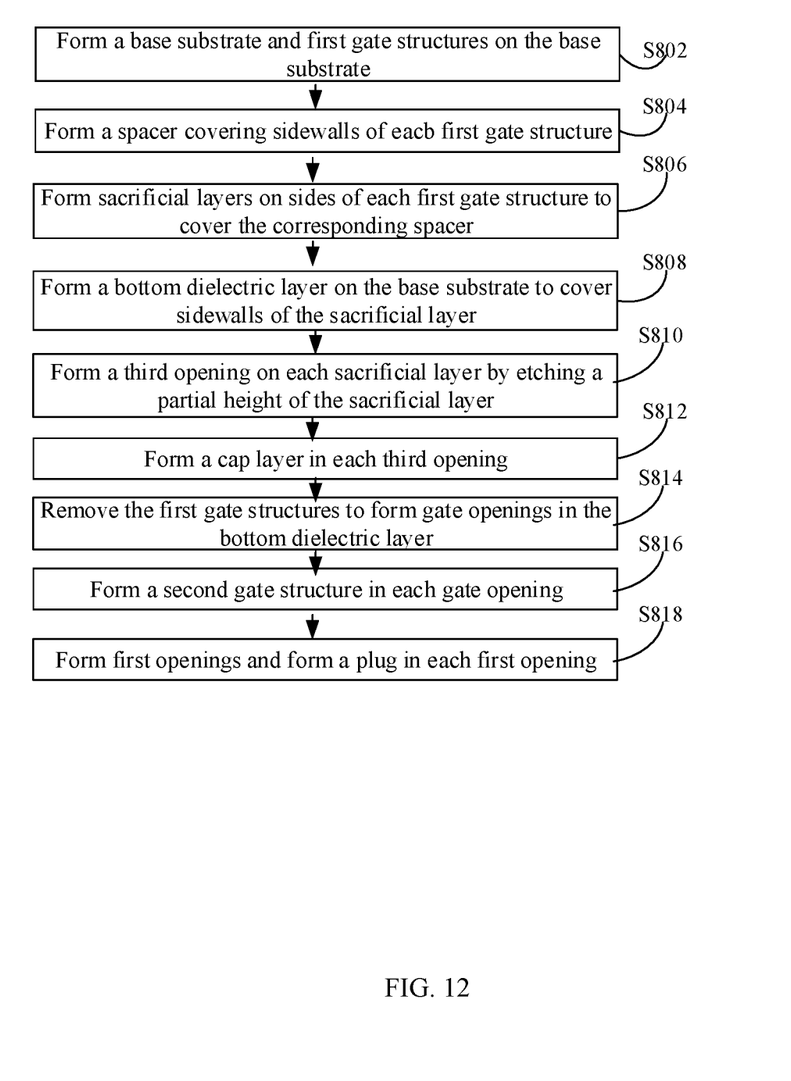
FIG. 12 illustrates an exemplary method for forming a semiconductor device according to various disclosed embodiments.

As illustrated in FIG. 11, a plug 230 may be formed in each first opening 210 and each second opening 230 (in Step S818 in FIG. 12).

In one embodiment, the method may further include forming a metal silicide layer on the surface of each source/drain doped layer 140 on the bottom of the corresponding first opening 210 and the corresponding second opening 220.

Various embodiments of the present disclosure also provide a semiconductor device formed by the above-described method.

In the methods for forming FinFETs provided by various embodiments of the present disclosure, a portion of the spacer on sidewalls of the first gate structures may regulate a distance between a plug and a corresponding first gate structure. The sacrificial layers may occupy spaces for the first openings. After forming the bottom dielectric layer, the sacrificial layers may be removed to form the first openings. Since the first openings may be formed by etching away the sacrificial layer instead of by etching a portion of the bottom dielectric layer, a selection of a material for the spacer may be not limited by a material of the bottom dielectric layer. Correspondingly, the spacer can be made of a material with a relatively low dielectric constant. Parasitic capacitances in the semiconductor structure may be reduced and the performance may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a semiconductor device, comprising:
    forming a base substrate and first gate structures on the base substrate;
    forming an offset spacer covering sidewalls of each first gate structure;
    forming source/drain doped layers in the base substrate on sides of each first gate structure;
    forming a spacer covering side surface of the offset spacer on the source/drain doped layers, wherein the source/drain doped layers have a side surface coplanar with an interface plane between the side surface of the offset spacer and side surface of the spacer;
    forming sacrificial layers on sidewalls of each first gate structure to cover corresponding spacers;
    forming a bottom dielectric layer covering sidewalls of the sacrificial layers;
    after forming the bottom dielectric layer, removing the sacrificial layers to form first openings between the bottom dielectric layer and the spacers; and
    forming a plug in each first opening.

2. The method according to claim 1, wherein the spacer is made of a material including silicon oxide, silicon carbon nitride, or a combination thereof.

3. The method according to claim 1, wherein the spacer has a dielectric constant of 2.5 to 3.7.

4. The method according to claim 1, wherein the spacer has a thickness of 5 nm to 12 nm.

5. The method according to claim 1, wherein the sacrificial layers are made of a material including amorphous silicon, polysilicon, or a combination thereof.

6. The method according to claim 1, wherein:
each first gate structure has first sides opposite to each other and second sides opposite to each other;
the sacrificial layers cover a portion of the spacers on sidewalls of the first sides of the first gate structures; and
the sacrificial layers are formed by:
forming a sacrificial film over the base substrate to cover the base substrate, the spacers, and the first gate structures;
planarizing the sacrificial film to remove a first portion of the sacrificial film on a top surface of each first gate structure; and
removing a second portion of the sacrificial film on the second sides of each first gate structure.

7. The method according to claim 1, wherein:
before forming the sacrificial layers, a portion of the spacers is also formed on the base substrate and on the top surface of each first gate structure;
a portion of the spacer on the top surface of each first gate structure is removed when forming the sacrificial layers; and
after forming the sacrificial layers, a portion of the spacer is located between the base substrate and the sacrificial layer.

8. The method according to claim 7, wherein the spacer is formed by an atomic layer deposition process.

9. The method according to claim 7, wherein:
a mask protection layer is formed on a top surface of each first gate structure;
before forming the sacrificial layers, a portion of the spacer is also formed on sidewalls and a top surface of each mask protection layer;
a portion of the spacer on the top surface of the mask protection layer is removed when forming the sacrificial layers;
the top surface of the mask protection layer is exposed after forming the sacrificial layers and before removing the first gate structures; and
the mask protection layer is removed after forming the bottom dielectric layer and before removing the first gate structures.

10. The method according to claim 7, further including:
before removing the first gate structures, etching a partial height of each sacrificial layer to make a top surface of the sacrificial layer lower than a top surface of the bottom dielectric layer, and to form a third opening on each sacrificial layer between the bottom dielectric layer and the spacer;
forming a cap layer in each third opening;
removing the first gate structures; and
removing the cap layers when forming the second gate structures.

11. The method according to claim 10, wherein the cap layers have a thickness of 20 nm to 50 nm.

12. The method according to claim 1, wherein:
before forming the sacrificial layers, a portion of the spacer is further located on a top surface of each source/drain doped layer;
a portion of the sacrificial layer is located on each corresponding source/drain doped layer;
the sacrificial layers are removed to expose the spacer on the top surface of each source/drain doped layer;
a portion of the spacer on a bottom of each first opening is etched to expose the top surface of the corresponding source/drain doped layer, and to form a second opening on the bottom of each first opening; and
a plug is also located in the corresponding second opening.

13. The method according to claim 12, before forming the plugs, further including:
forming a metal silicide layer on the top surface of each source/drain doped layer on the bottom of the corresponding first opening and the corresponding second opening.

14. The method according to claim 1, wherein forming offset spacers on the sidewalls of each first gate structure is performed before forming the source/drain doped layers, wherein:
the source/drain doped layers are formed in the base substrate on the sidewalls of each first gate structure and of each offset spacer.

15. The method according to claim 14, wherein the offset spacers are made of a material including SiNx.

16. The method according to claim 15, wherein when removing the sacrificial layers by etching:
a ratio between an etching rate of the sacrificial layers and an etching rate of the spacer is 80:1 to 200:1; and
a ratio between the etching rate of the sacrificial layers and an etching rate of the bottom dielectric layer is 50:1 to 100:1.

17. A fabrication method for a semiconductor device, comprising:
forming a base substrate and first gate structures on the base substrate;
forming a spacer covering sidewalls of each first gate structure;
forming sacrificial layers on sidewalls of each first gate structure to cover corresponding spacers;
forming a bottom dielectric layer covering sidewalls of the sacrificial layers;
after forming the bottom dielectric layer, removing the sacrificial layers to form first openings between the bottom dielectric layer and the spacers; and
forming a plug in each first opening, after forming the bottom dielectric layer and before removing the sacrificial layers, further including:
removing the first gate structures to form gate openings in the bottom dielectric layer, wherein a portion of the spacer is located on the sidewalls of each gate opening;
forming a second gate structure in each gate opening; and
removing sacrificial layers.

18. The method according to claim 17, wherein the spacer is made of a material including silicon oxide, silicon carbon nitride, or a combination thereof.

19. The method according to claim 17, wherein the spacer has a dielectric constant of 2.5 to 3.7.

20. The method according to claim 17, wherein the spacer has a thickness of 5 nm to 12 nm.

21. The method according to claim 17, wherein the spacer has a thickness of 5 nm to 12 nm.

* * * * *